(12) United States Patent
Haran

(10) Patent No.: US 10,623,706 B2
(45) Date of Patent: Apr. 14, 2020

(54) SYNCHRONIZATION CIRCUIT FOR OSCILLATING MIRROR AND LASER

(71) Applicant: STMicroelectronics Ltd, Netanya (IL)

(72) Inventor: Elik Haran, Kfar Saba (IL)

(73) Assignee: STMicroelectronics Ltd, Netanya (IL)

( * ) Notice: Subject to any disclaimer, the term of this patent is extended or adjusted under 35 U.S.C. 154(b) by 157 days.

(21) Appl. No.: 15/689,871

(22) Filed: Aug. 29, 2017

(65) Prior Publication Data
US 2019/0068933 A1   Feb. 28, 2019

(51) Int. Cl.
G02B 26/08 (2006.01)
H04N 9/31 (2006.01)
H04N 5/06 (2006.01)
H03L 7/08 (2006.01)
H03K 21/40 (2006.01)

(52) U.S. Cl.
CPC ............ H04N 9/3135 (2013.01); H04N 5/06 (2013.01); H04N 9/3155 (2013.01); H04N 9/3161 (2013.01); H03K 21/40 (2013.01); H03L 7/08 (2013.01)

(58) Field of Classification Search
CPC ...... H04N 9/3135; H04N 9/3155; H04N 5/06; H04N 9/3161; H03L 7/08

USPC ..................................................... 359/213.1
See application file for complete search history.

(56) References Cited

U.S. PATENT DOCUMENTS 8,581,643 B1* 11/2013 Schmitt ..................... H03L 7/07
327/147
2015/0161926 A1* 6/2015 Ogi ....................... H04N 9/3129
345/207

* cited by examiner

*Primary Examiner* — Euncha P Cherry
(74) *Attorney, Agent, or Firm* — Crowe & Dunlevy

(57) ABSTRACT

Disclosed herein is a control system for a laser scanning projector. The control system includes a mirror controller generating a mirror synchronization signal for an oscillating mirror apparatus based upon a mirror clock signal. The control system also includes laser modulation circuitry for generating a laser synchronization signal as a function of a laser clock signal, and generating control signals for a laser that emits a laser beam that impinges on the oscillating mirror apparatus. Synchronization circuitry is for generating the laser clock signal and sending the laser clock signal to the laser modulation circuitry, receiving the mirror synchronization signal from the mirror controller, receiving the laser synchronization signal from the laser modulation circuitry, and modifying frequency and phase of the laser clock signal for the laser as a function of the mirror synchronization signal and the laser synchronization signal.

22 Claims, 8 Drawing Sheets

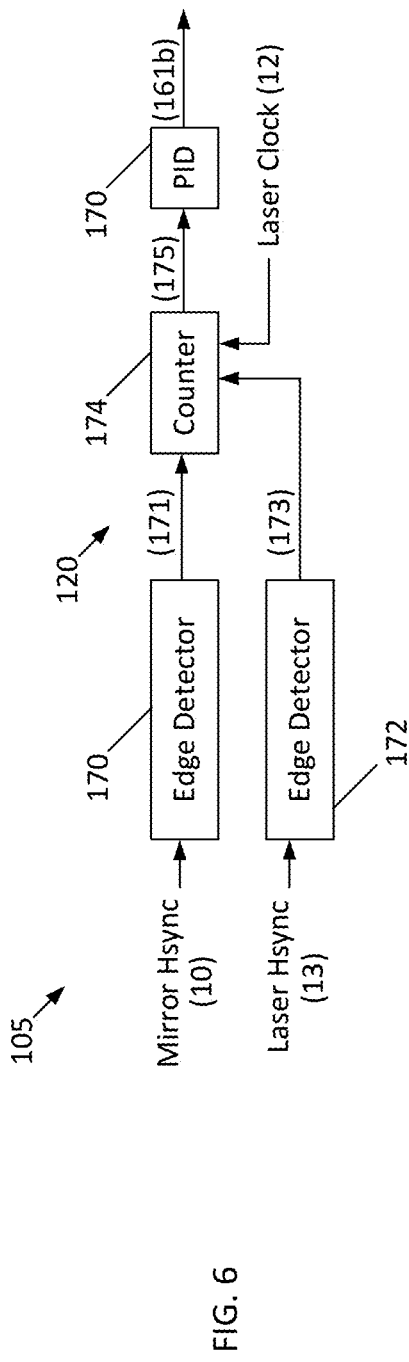
FIG. 6
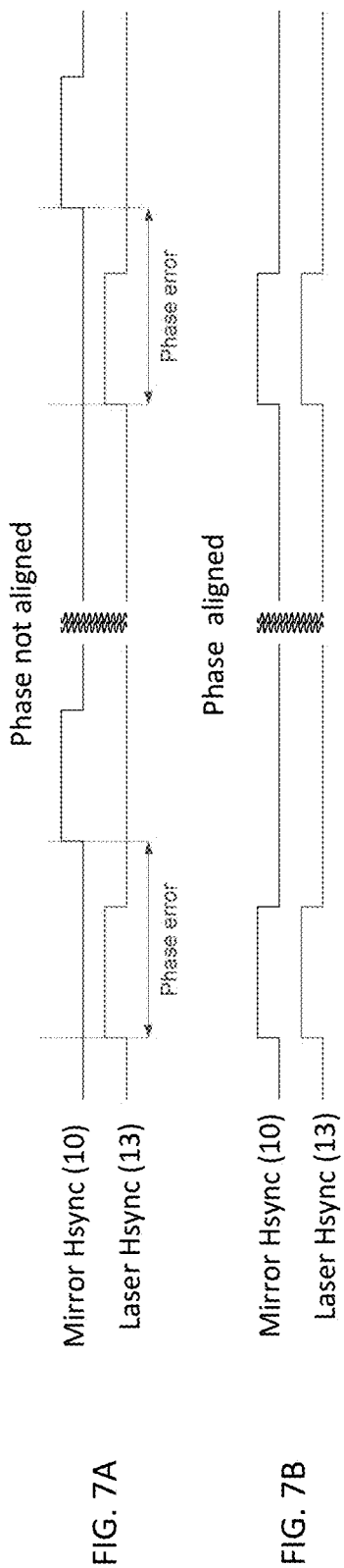
FIG. 7A
FIG. 7B

SYNCHRONIZATION CIRCUIT FOR OSCILLATING MIRROR AND LASER

TECHNICAL FIELD

This disclosure is related to the field of oscillating mirrors and lasers used to form laser projection systems and, in particular, to circuits, techniques, and methods for synchronizing signals between control circuits for the oscillating mirrors and control circuits for the lasers in such laser projection systems.

BACKGROUND

Certain devices such as wafer defect scanners, laser printers, document scanners, projectors and the like may employ a laser beam that scans across a flat surface in a straight line path. So as to effectuate this scanning, these devices employ tilting mirrors to deflect the laser beam. These tilting mirrors may be, or may include, Micro Electro Mechanical Systems ("MEMS") devices. The laser light reflected by the tiling mirrors may be of a visible wavelength (for instance, the three red/green/blue colors) or of invisible wavelength (for instance, infrared light for 3-D imaging).

A conventional laser projection system 50 is now described with reference to FIG. 1. The laser projection system 50 includes a MEMS mirror 56, driven by a mirror driver 54, which implements the desired drive signal, whether it be high current (for electromagnetically driven MEMS mirrors) or high voltage (for electrostatically or piezoelectrically driven mirrors). The mirror driver 54 is controlled by a mirror controller 52 using a control signal 61 to control the waveform and the amplitude of the output analog drive signal 63.

The mirror controller 52, which may be incorporated within an application specific integrated circuit (ASIC), also functions to drive a synchronization signal 51 and clock signal 53 toward laser modulation logic 58, which sends a control signal 55 to a laser driver 60, which in turn generates a drive signal 57 that modulates the laser 62 in order to position the correct pixel in the laser beam 59 in correspondence to the movement of the MEMS mirror 56. This synchronization is critical, because if the driving of the laser 62 and the MEMS mirror 56 are not properly synchronized, the desired scan pattern is not formed, and the laser projection system 50 is considered to have malfunctioned.

However, it may be undesirable to send the clock signal 53 from the mirror controller 52 to the laser modulation logic 58 for a variety of reasons. For example, the mirror controller 52 and laser modulation logic 58 may be located within separate integrated circuits, and thus a pin or pad would be required to send and receive the clock signal 53 via such pin or pad. Particularly in the case of a laser projection system 50 used for forming high resolution images, the clock signal 53 is of a high frequency (on the order of GHz), and thus the sending of the clock signal 53 would consume power on the order of tens of milliwatts. This is undesirable for portable electronics applications which run on battery power, such as picoprojectors, smartphones, modular add on devices for smartphones, tablets, smartwatches, and the like.

Therefore, further development of circuits, techniques, and methods for synchronizing the mirror controller and laser modulation logic within a laser projection system is needed.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a control system for a laser scanning projector. The control system includes a mirror controller generating a mirror synchronization signal for an oscillating mirror apparatus based upon a mirror clock signal. The control system also includes laser modulation circuitry for generating a laser synchronization signal as a function of a laser clock signal, and generating control signals for a laser that emits a laser beam that impinges on the oscillating mirror apparatus. Synchronization circuitry is for generating the laser clock signal and sending the laser clock signal to the laser modulation circuitry, receiving the mirror synchronization signal from the mirror controller, receiving the laser synchronization signal from the laser modulation circuitry, and modifying frequency and phase of the laser clock signal for the laser as a function of the mirror synchronization signal and the laser synchronization signal.

Also disclosed herein is another embodiment of a control system for a laser scanning projector. This embodiment includes a mirror controller generating a mirror synchronization signal for an oscillating mirror apparatus based upon a mirror clock signal. This embodiment also includes laser modulation circuitry generating control signals for a laser that emits a laser beam that impinges on the oscillating mirror apparatus. Synchronization circuitry generates a laser clock signal and send the laser clock signal to laser modulation circuitry, receives a mirror synchronization signal from the mirror controller, generates a laser synchronization signal as a function of the laser clock signal, and modifies frequency and phase of the laser clock signal as a function of the mirror synchronization signal and the laser synchronization signal.

A further embodiment disclosed herein is directed to a control system for a laser scanning projector. This embodiment includes a mirror controller generating a mirror synchronization signal for an oscillating mirror apparatus based upon a mirror clock signal, and a laser controller generating control signals for a laser that impinges on the oscillating mirror apparatus. The laser controller includes clock control circuitry generating a laser clock signal, and laser modulation circuitry configured to, in a first mode, generate a laser synchronization signal and the control signals for the laser as a function of the laser clock signal, and in a second mode, generate the control signals for the laser as a function of the laser clock signal. Synchronization circuitry includes laser synchronization signal generation circuitry configured to, in the second mode, generate the laser synchronization signal. A multiplexer receives input from the laser synchronization signal generation circuitry and the laser modulation circuit, and is configured to output the laser synchronization signal from the laser modulation circuitry in the first mode and to output the laser synchronization signal from the laser synchronization signal generation circuitry in the second mode. The clock control circuitry receives the mirror synchronization signal and output from the multiplexer, and generates the laser clock signal for the laser as a function of the mirror synchronization signal and the output from the multiplexer.

BRIEF DESCRIPTION OF THE DRAWINGS

FIG. 6 is a schematic block diagram of circuitry within the synchronization mechanism of FIGS. 2-3 for aligning the phase of synchronization signals generated externally to the mirror controller with that of synchronization signals generated within the mirror controller.

FIGS. 7A-7B respectively show the states of the phase of the synchronization signals of FIG. 6 not being aligned, and then being aligned.

DETAILED DESCRIPTION

One or more embodiments of the present disclosure will be described below. These described embodiments are only examples of the presently disclosed techniques. Additionally, in an effort to provide a concise description, certain nonessential features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Figure 1:
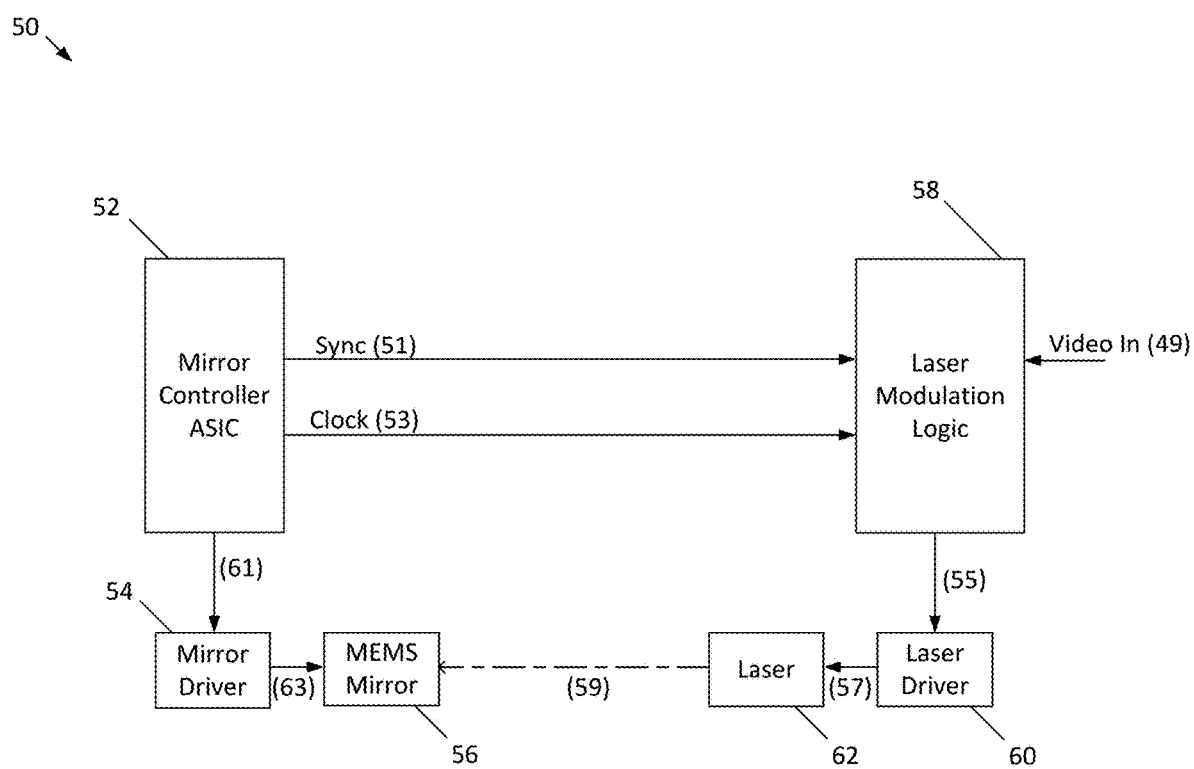
FIG. 1 is a block diagram of a conventional laser projection system.
Figure 2:
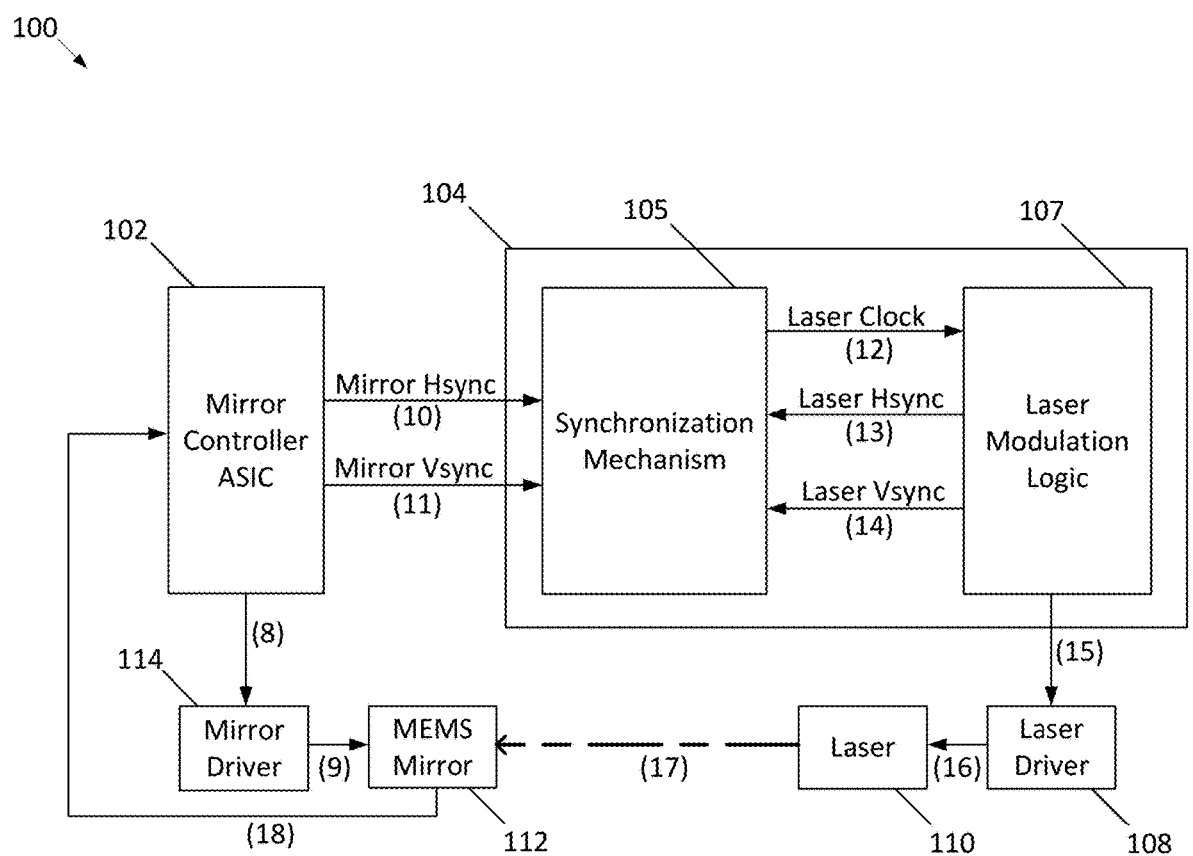
FIG. 2 is a schematic block diagram of a first embodiment of a laser projection system in accordance with this disclosure.

With initial reference to FIG. 2, a laser projection system 100 is now described. The laser projection system 100 includes a MEMS mirror 112 which is driven with a drive signal 9 generated by a mirror driver 114. The driving of the MEMS mirror 112 by the mirror driver 114 may be electromagnetically, electrostatically, quasistatically, piezoelectrically, or in any other suitable fashion.

The mirror driver 114 is controlled by a control signal 8 from a mirror controller 102, which may be an ASIC (application specific integrated circuit). The mirror controller 102 receives a mirror sense signal 18 from the MEMS mirror 112 as feedback, and based upon analysis or processing of the received mirror sense signal 18, alters the control signal 8 so as to cause the MEMS mirror 112 to be driven to a desired opening angle.

The mirror controller 102 is depicted as further generating both a horizontal sync HSync 10 signal and a vertical sync VSync 11 signal and sending both signals to synchronization mechanism 105, but it should be understood that in some applications, only one of the synchronization signals (for example, HSync 10) is sent to the synchronization mechanism 105.

The synchronization mechanism 105 also generates a clock 12. The synchronization mechanism 105 also receives versions of the HSync 13 and VSync 14 signals generated internally by the laser modulation logic 107, and modifies the clock 12 for the laser modulation logic 107 as a function of a comparison between HSync 10 and VSync 11 from the mirror controller 102 and HSync 13 and VSync 14 from the laser modulation logic 107. It should be understood that in some applications, only one of the synchronization signals (for example, HSync 13) is sent to the synchronization mechanism 105 by the laser modulation logic 107. Likewise, it should be understood that the modification of the clock 12 may be performed based upon a comparison of Hsync 10 to HSync 13, without comparisons being performed on and between Vsync 11 and Vsync 14. In these applications, VSync 11 is an integer multiple of HSync 10, and VSync 14 is an integer multiple of HSync 13, and thus VSync 14 may be generated from HSync 13. Therefore, since VSync 14 is generated from HSync 13 in these cases, the performance of a separate synchronization on VSync 11 and VSync 14 is not necessary.

It should further be understood that the generation of the clock 12 is performed without receipt of an internal clock signal from the mirror controller 102, and that HSync 10, VSync 11, HSync 13, and VSync 14 all have frequencies that are less than that of the clock 12 and the clock internal to the mirror controller 102.

As noted, the laser modulation logic 107 generates HSync 13 and VSync 14. HSync 13 and VSync 14 are generated by the laser modulation logic 107 based upon the clock 12. Thus, as will be explained below, by controlling the clock 12, HSync 13 and VSync 14 can be controlled.

The laser modulation logic 107 uses the clock 12, as well as HSync 13 and VSync 14, to generate a control signal 15 for laser driver 108, which generates a drive current 16 for the laser 110. The laser 110 emits a laser beam 17 as a function of the drive current 16.

Figure 4:
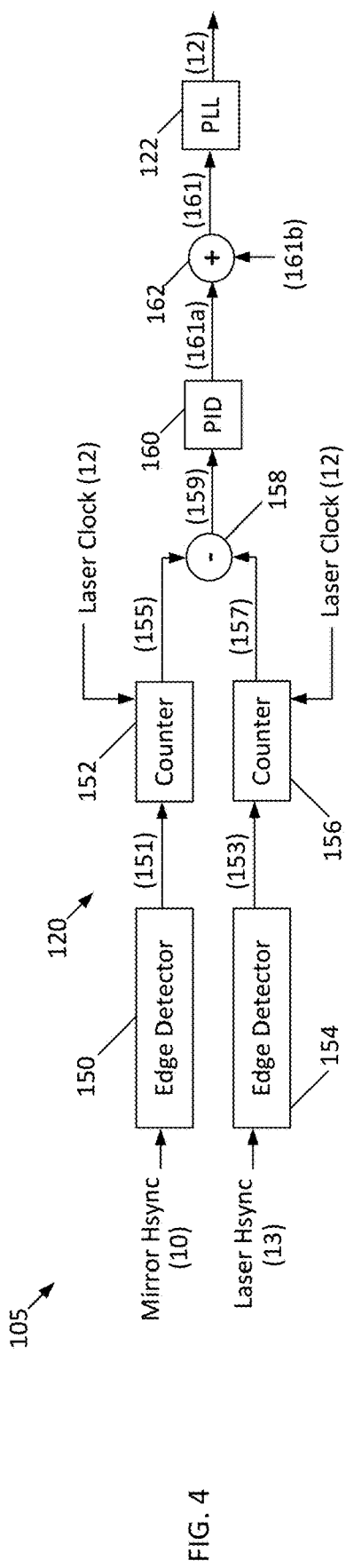
FIG. 4 is a schematic block diagram of circuitry within the synchronization mechanism of FIGS. 2-3 for aligning the frequency of synchronization signals generated externally to the mirror controller with that of synchronization signals generated within the mirror controller.

The synchronization performed by the synchronization mechanism 105 will now be described. Here, the synchronization refers to the synchronization of the clock 12 to the clock internal to the mirror controller 102, in both frequency and phase. First, the synchronization in frequency will be described. Referring additionally to FIG. 4, the synchronization mechanism 105 includes a clock control circuit 120, which itself includes edge detectors 150 and 154. Edge detector 150 receives HSync 10 while edge detector 154 receives HSync 13. At each detection of a rising edge of HSync 10, edge detector 150 asserts its output signal 151; similarly, at each detection of a rising edge of HSync 13, edge detector 154 asserts its output signal 153. Counters 152 and 156 respectively receive the output signals 151 and 153, and count cycles of clock 12 between one assertion of the output signals 151 and 153, and an immediately subsequent assertion of output signals 151 and 153. Thus, the edge detectors 150, 154 work in conjunction with the counters 152, 156 to count the number of pulses of clock 12 between two consecutive rising edges of HSync 10 and HSync 13.

The counters 152 and 156 output their clock counts as signals 155 and 157 to subtractor 158, which determines the difference in the counts, as signal 159.

It is noted that the number of pulses of clock 12 between two consecutive rising edges of HSync 10, multiplied by the period of the clock 12, is the frequency of the MEMS mirror 112. Similarly, the number of pulses of clock 12 between two consecutive rising edges of HSync 13, multiplied by the period of the clock 12, is the estimated frequency of the MEMS mirror 112.

Figure 5A:
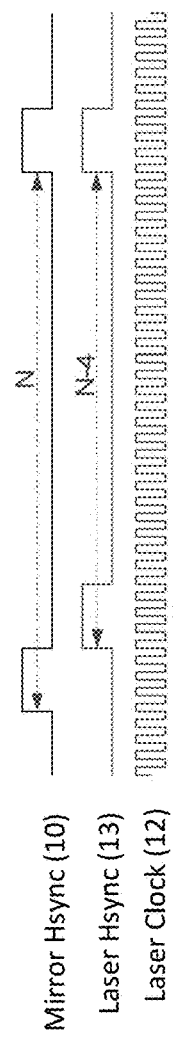
FIGS. 5A-5B respectively show the states of the frequency of the synchronization signals of FIG. 4 not being aligned, and then being aligned.
Figure 5B:

Thus, since HSync 13 and VSync 14 are generated as a function of the clock 12, when there is a difference between the counts determined by counters 152 and 156, the frequency of clock 12 is not matched to that of the internal clock of the mirror controller 102. This difference is generated as a frequency alignment error signal 159, which is passed to a control loop 160 (e.g. a proportional-integral-derivative loop) that generates a control word 161*a*. Control word 161*a* is added to control word 161*b* (the generation of which will be described below but relates to phase alignment) by adder 162, to produce control word 161 for a digital phase locked loop 122, that in turn generates the clock 12. Thus, through this mechanism, the clock 12 is adjusted until there is no frequency mismatch between HSync 10 and HSync 13, meaning that there is no frequency mismatch between the clock 12 and the internal clock of the mirror controller 102. FIG. 5A depicts a frequency mismatch between HSync 10 and HSync 13, and FIG. 5B shows frequency alignment between HSync 10 and HSync 13. As shown, the number of pulses of the clock 12 in one period of Hsync 10 is N. In the mismatch shown in FIG. 5A, the number of pulses of the clock 12 in one period of HSync 13 is N-4. However, in the match shown in FIG. 5B, the number of pulses of the clock 12 in one period of Hsync 10 is N, and likewise the number of pulses of the clock 12 in one period of HSync 13 is N.

Now, the synchronization of the clock 12 to the clock internal to the mirror controller 102 in phase will be described with additional reference to FIG. 6. Here, the clock control circuit 120 includes edge detectors 170 and 172, which respectively receive HSync 10 and Hsync 13. At each receipt of a rising edge, the edge detectors 170 and 172 assert their output signals 171 and 173. The counter 174 receives output signals 171 and 173, and counts the number of pulses of clock 12 between assertions of output signals 171 and 173. The count signal 175 generated by counter 174 is passed to a control loop 170 (e.g. a proportional-integral-derivative loop) that generates the control word 161*b* for the PLL 122. Therefore, through this mechanism, the clock 12 is adjusted until there is no phase mismatch between HSync 10 and HSync 13, meaning that there is no phase mismatch between the clock 12 and the internal clock of the mirror controller 102. FIG. 7A depicts a phase mismatch between HSync 10 and HSync 13, and FIG. 7B shows phase alignment between HSync 10 and HSync 13.

It is noted that in some applications, operation for phase alignment does not begin until frequency alignment has been achieved. Thus, FIG. 6 generates the control word 161*b* with a value of 0 until the frequency is locked. Then, phase alignment begins and the FIG. 6 circuit generates the value for 161*b* that will align the phase.

It should be understood that the mirror controller 102 may be on a separate integrated circuit from the synchronization mechanism 105 and laser modulation logic 107, both of which may be integrated into a single integrated circuit 104 that is separate and distinct from the integrated circuit of the mirror controller 102. Stated another way, the mirror controller 102 is, in some cases, not located on a same integrated circuit as the synchronization mechanism 105 and laser modulation logic 107.

Alternative or additional embodiments will now be described. For example, in the laser projection system 100' shown in FIG. 3, HSync 13 and VSync 14 are generated by the synchronization mechanism 105 and not by the laser modulation logic 107. Operation of the laser projection system 100' otherwise proceeds as noted above.

Figure 3:
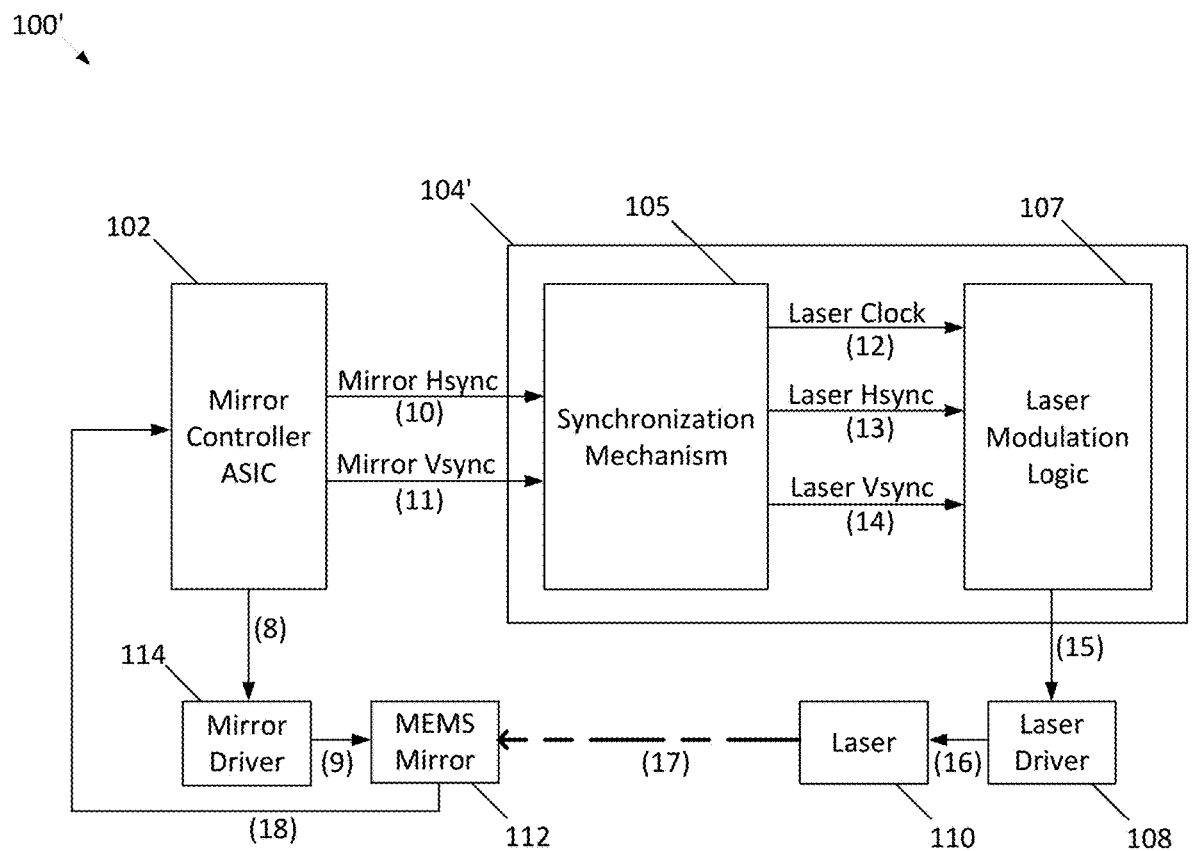
FIG. 3 is a schematic block diagram of a second embodiment of a laser projection system in accordance with this disclosure.
Figure 8:
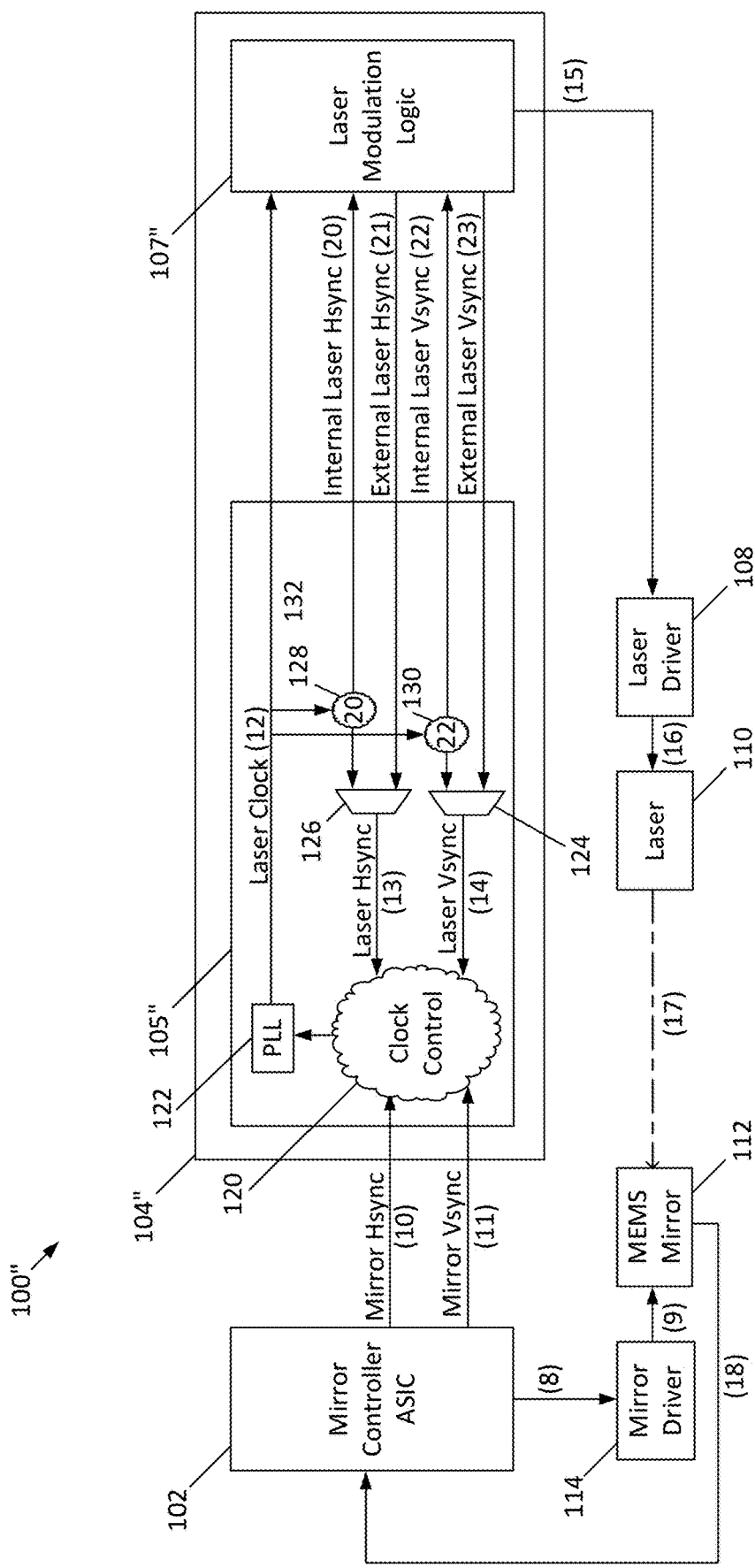
FIG. 8 is a schematic block diagram of a third embodiment of a laser projection system in accordance with this disclosure capable of operating as that of FIG. 2 in a first mode and as that of FIG. 3 in a second mode.

As another alternative, the laser projection system 100" shown in FIG. 8 is capable of operating according to the same process as the laser projection system 100' of FIG. 3, or the same process as the laser projection system 100" of FIG. 4. To effectuate this, the synchronization mechanism 105" includes multiplexers 126 and 124. Multiplexer 126 receives input from the laser modulation logic 107 in the form of HSync 21, and from HSync generator 128 (which is internal to the synchronization mechanism 105") in the form of Hsync 20. When operating as the laser projection system 100 of FIG. 2, the multiplexer passes HSync 21 as HSync 13 to the clock control circuit 120, the operation of which is the same as described above in other embodiments. When operating as the laser projection system 100' of FIG. 3, the multiplexer 126 passes HSync 20 as HSync 13 to the clock control circuit 120.

Multiplexer 124 receives input from the laser modulation logic 107 in the form of VSync 23, and from VSync generator 130 (which is internal to the synchronization mechanism 105") in the form of Vsync 22. When operating as the laser projection system 100 of FIG. 2, the multiplexer passes VSync 23 as VSync 14 to the clock control circuit 120. When operating as the laser projection system 100' of FIG. 3, the multiplexer 124 passes VSync 22 as VSync 14 to the clock control circuit 120.

Figure 9:
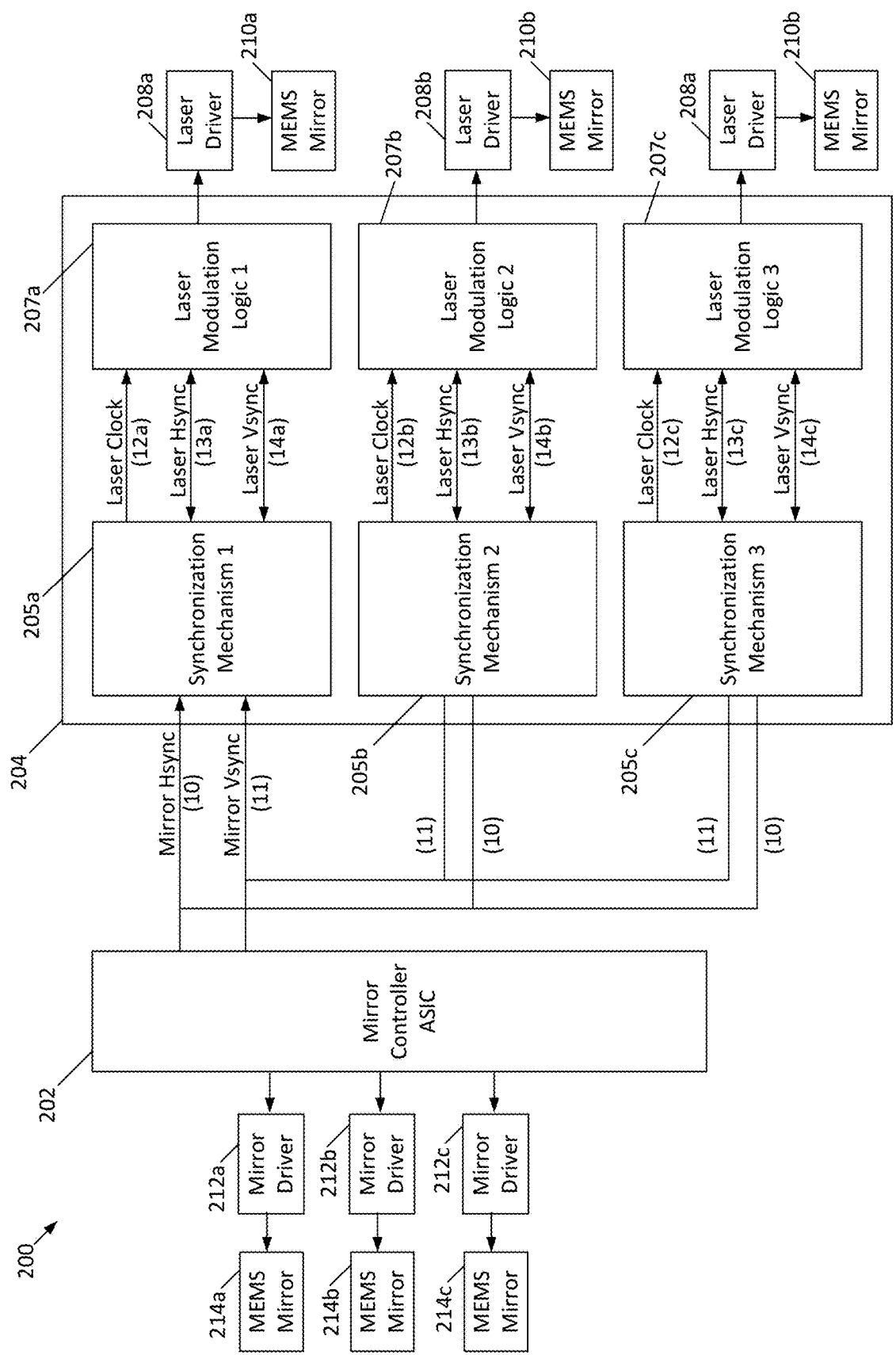
FIG. 9 is a schematic block diagram of a fourth embodiment of a laser projection system in accordance with this disclosure in which a single mirror controller interfaces with multiple synchronization mechanisms and multiple laser modulation logic circuits.

As shown in the laser projection system 200 of FIG. 9, a single mirror controller 202 may operate multiple MEMS mirrors 214*a*, 214*b*, 214*c*, and each mirror may have a respective laser 210*a*, 210*b*, 210*c* associated with it. Thus, as shown, the mirror controller 202 and may provide HSync 10 and VSync 11 to the respective different synchronization mechanisms 205*a*, 205*b*, 205*c* for respective different laser modulation logics 207*a*, 207*b*, 207*c* which operate respective different lasers 210*a*, 210*b*, 210*c*. The synchronization mechanisms 205*a*, 205*b*, 205*c* may operate as any of the synchronization mechanisms described above.

Figure 10:
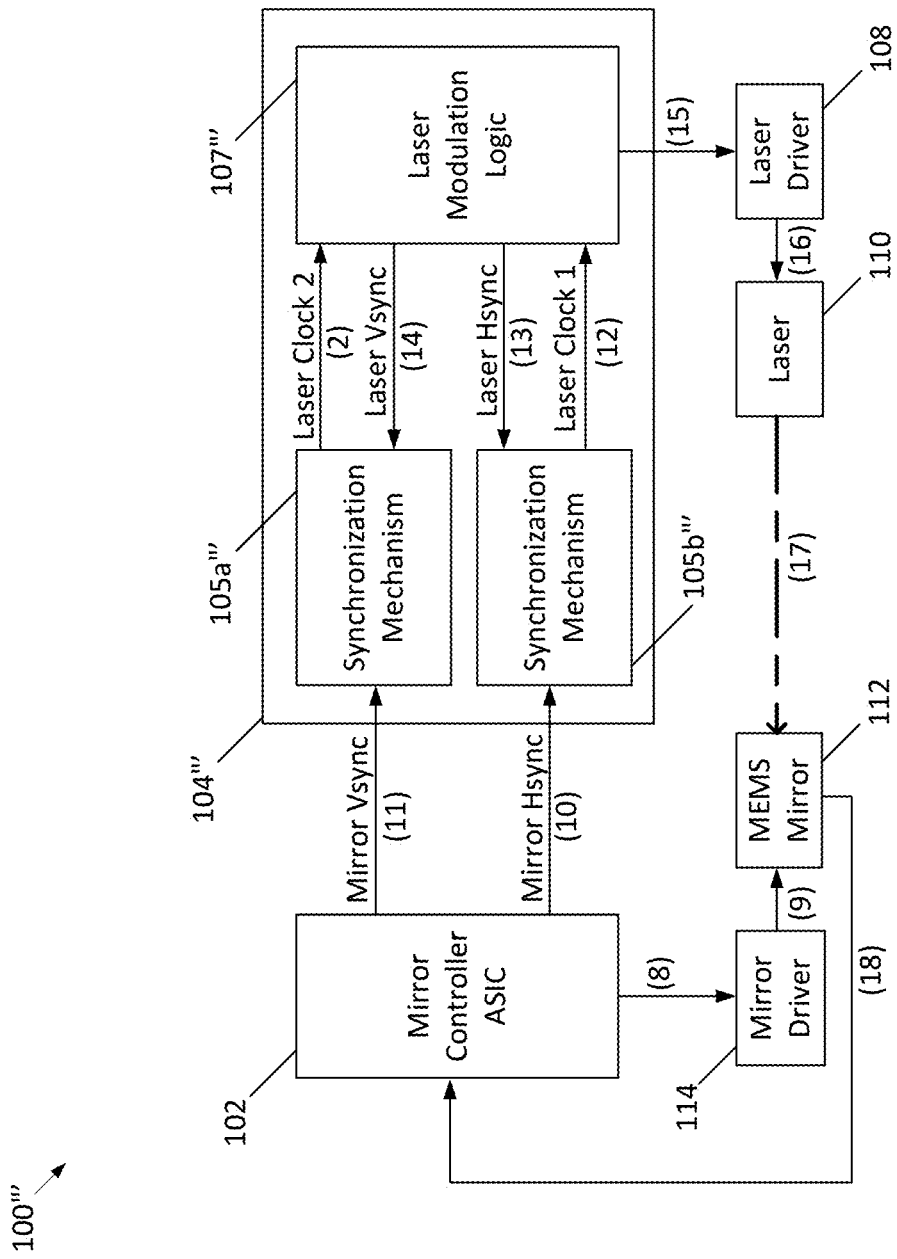
FIG. 10 is a schematic block diagram of a fifth embodiment of a laser projection system in accordance with this disclosure in which separate laser clocks are generated for use in generating the HSync and VSync signals.

As yet another variation shown in FIG. 10, in the case where VSync 11 is not an integer multiple of HSync 10, two separate synchronization blocks 105*a'''*, 105*b'''*, each operating as described above, can be used to generate two separate clocks 2 and 12. Synchronization block 105*a'''* receives VSync 11 from the mirror controller 102, receives VSync 14 from laser modulation logic 107''', performs the synchronization functions described above on VSync 11 and VSync 14 so as to generate clock 2. Similarly, synchronization block 105*b'''* receives HSync 10 from the mirror controller 102, receives HSync 13 from laser modulation logic 107''', and performs the synchronization functions described on HSync 10 and HSync 13 above so as to generate clock 12.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A control system for a laser scanning projector, comprising:
   a mirror controller configured to generate a mirror synchronization signal for an oscillating mirror apparatus based upon a mirror clock signal;
   laser modulation circuitry configured to:
      generate a laser synchronization signal as a function of a laser clock signal; and
      generate control signals for a laser that emits a laser beam that impinges on the oscillating mirror apparatus; and
   synchronization circuitry configured to:
      generate the laser clock signal and send the laser clock signal to the laser modulation circuitry;
      receive the mirror synchronization signal from the mirror controller;
      receive the laser synchronization signal from the laser modulation circuitry; and
      modify frequency and phase of the laser clock signal for the laser as a function of the mirror synchronization signal and the laser synchronization signal.

2. The control system of claim 1, wherein the synchronization circuitry generates and modifies the laser clock signal by:
   generating the laser clock signal;
   counting a first number of pulses of the laser clock signal between two consecutive transitions of a same direction of the mirror synchronization signal;
   counting a second number of pulses of the laser clock signal between two consecutive transitions of a same direction of the laser synchronization signal;
   determining a frequency alignment error between the mirror synchronization signal and the laser synchronization signal as a function of a difference between the first and second numbers of pulses; and
   adjusting a frequency of the laser clock signal as a function of the frequency alignment error such that the laser synchronization signal has its frequency aligned with that of the mirror synchronization signal.

3. The control system of claim 2, wherein the synchronization circuitry comprises a digitally controlled phase locked loop configured to generate the laser clock signal; and wherein the synchronization circuitry operates in a frequency alignment mode to generate a first control word for the digitally controlled phase locked loop as a function of the frequency alignment error to cause the digitally controlled phase locked loop to generate the laser synchronization signal as having a frequency aligned with that of the mirror synchronization signal.

4. The control system of claim 3, wherein the synchronization circuitry generates the first control word using a proportional-integral-derivative control scheme.

5. The control system of claim 3, wherein the synchronization circuitry operates in a phase alignment mode, after frequency alignment between the laser synchronization signal and the mirror synchronization signal has been achieved, to:
   count a third number of pulses of the laser clock signal between an edge of the mirror synchronization signal and an edge of the laser synchronization signal having a same edge type as that of the edge of the mirror synchronization signal; and
   generate a second control word for the digitally controllable phase locked loop to be added to the first control word based upon the third number of pulses.

6. The control system of claim 1, wherein the mirror controller is embodied within a first integrated circuit; and wherein the synchronization circuitry and laser modulation circuitry are embodied within a second integrated circuit different than the first integrated circuit.

7. A control system for a laser scanning projector, comprising:
   a mirror controller configured to generate a mirror synchronization signal for an oscillating mirror apparatus based upon a mirror clock signal;
   laser modulation circuitry configured to generate control signals for a laser that emits a laser beam that impinges on the oscillating mirror apparatus; and
   synchronization circuitry configured to:
      generate a laser clock signal and send the laser clock signal to laser modulation circuitry;
      receive a mirror synchronization signal from the mirror controller;
      generate a laser synchronization signal as a function of the laser clock signal; and
      modify frequency and phase of the laser clock signal as a function of the mirror synchronization signal and the laser synchronization signal.

8. The control system of claim 7, wherein the synchronization circuitry generates and modifies the laser clock signal by:
   generating the laser clock signal;
   counting a first number of pulses of the laser clock signal between two consecutive transitions of a same direction of the mirror synchronization signal;
   counting a second number of pulses of the laser clock signal between two consecutive transitions of a same direction of the laser synchronization signal;
   determining a frequency alignment error between the mirror synchronization signal and the laser synchronization signal as a function of a difference between the first and second numbers of pulses; and
   adjusting a frequency of the laser clock signal as a function of the frequency alignment error such that the laser synchronization signal has its frequency aligned with that of the mirror synchronization signal.

9. The control system of claim 8, wherein the synchronization circuitry further modifies the laser clock signal, once the laser synchronization signal has a frequency aligned with that of the mirror synchronization signal, by:
   counting third a number of pulses of the laser clock signal between an edge of the mirror synchronization signal and an edge of the laser synchronization signal having a same edge type as the edge of the mirror synchronization signal; and
   adjusting the laser clock signal based upon the third number of pulses such that ultimately the laser synchronization signal has a phase aligned with that of the mirror synchronization signal.

10. The control system of claim 8, wherein the synchronization circuitry comprises a digitally controlled phase locked loop to generate the laser clock signal; and wherein the synchronization circuitry generates a first control word for the digitally controlled phase locked loop as a function of the frequency alignment error to cause the digitally controlled phase locked loop to generate the laser synchronization signal as having a frequency aligned with that of the mirror synchronization signal.

11. The control system of claim 10, wherein the synchronization circuitry generates the first control word using a proportional-integral-derivative control scheme.

12. The control system of claim 10, wherein the synchronization circuitry further modifies the laser clock signal, once the laser synchronization signal has a frequency aligned with that of the mirror synchronization signal, by:
- counting third a number of pulses of the laser clock signal between an edge of the mirror synchronization signal and an edge of the laser synchronization signal having a same edge type as the edge of the mirror synchronization signal; and
- generating a second control word for the digitally controllable phase locked loop to be added to the first control word based upon the third number of pulses.

13. The control system of claim 7, wherein the mirror controller is embodied within a first integrated circuit; and wherein the synchronization circuitry and laser modulation circuitry are embodied within a second integrated circuit different than the first integrated circuit.

14. A control system for a laser scanning projector, comprising:
- a mirror controller configured to generate a mirror synchronization signal for an oscillating mirror apparatus based upon a mirror clock signal;
- a laser controller configured to generate control signals for a laser that impinges on the oscillating mirror apparatus, the laser controller comprising:
  - clock control circuitry configured to generate a laser clock signal;
  - laser modulation circuitry configured to, in a first mode, generate a laser synchronization signal and the control signals for the laser as a function of the laser clock signal, and in a second mode, generate the control signals for the laser as a function of the laser clock signal; and
  - synchronization circuitry comprising:
    - laser synchronization signal generation circuitry configured to, in the second mode, generate the laser synchronization signal; and
    - a multiplexer receiving input from the laser synchronization signal generation circuitry and the laser modulation circuitry, the multiplexer configured to output the laser synchronization signal from the laser modulation circuitry in the first mode and to output the laser synchronization signal from the laser synchronization signal generation circuitry in the second mode;
  - wherein the clock control circuitry is further configured to receive the mirror synchronization signal and the laser synchronization signal output from the multiplexer, and to generate the laser clock signal for the laser as a function of the mirror synchronization signal and the laser synchronization signal output from the multiplexer.

15. The control system of claim 14, wherein the clock control circuit generates the laser clock signal by:
- generating the laser clock signal;
- counting a first number of pulses of the laser clock signal between two consecutive transitions of a same direction of the mirror synchronization signal;
- counting a second number of pulses of the laser clock signal between two consecutive transitions of a same direction of the laser synchronization signal;
- determining a frequency alignment error between the mirror synchronization signal and the laser synchronization signal as a function of a difference between the first and second numbers of pulses; and
- adjusting the laser clock signal as a function of the frequency alignment error such that the laser synchronization signal has a frequency aligned with that of the mirror synchronization signal.

16. The control system of claim 15, wherein the clock control circuit comprises a digitally controlled phase locked loop to generate the laser clock signal; and wherein the clock control circuit generates a first control word for the digitally controlled phase locked loop as a function of the frequency alignment error to cause the digitally controlled phase locked loop to adjust the laser synchronization signal to have a frequency aligned with that of the mirror synchronization signal.

17. The control system of claim 16, wherein the clock control circuit further adjusts the laser clock signal, once the laser synchronization signal has a frequency aligned with that of the mirror synchronization signal, by:
- counting third a number of pulses of the laser clock signal between an edge of the mirror synchronization signal and an edge of the laser synchronization signal having a same edge type as the edge of the mirror synchronization signal; and
- generating a second control word for the digitally controllable phase locked loop to be added to the first control word, based upon the third number of pulses.

18. A method of controlling a laser scanning projector, comprising:
- in a first integrated circuit:
  - generating a mirror synchronization signal for an oscillating mirror apparatus based upon a mirror clock signal; and
- in a second integrated circuit:
  - generating control signals for a laser that emits a laser beam that impinges on the oscillating mirror apparatus;
  - generating a laser clock signal;
  - generating a laser synchronization signal as a function of the laser clock signal;
  - receiving the mirror synchronization signal from the first integrated circuit; and
  - modifying frequency and phase of the laser clock signal for the laser as a function of the mirror synchronization signal and the laser synchronization signal.

19. The method of claim 18, wherein the laser clock signal is generated and modified by:
- counting a first number of pulses of the laser clock signal between two consecutive transitions of a same direction of the mirror synchronization signal;
- counting a second number of pulses of the laser clock signal between two consecutive transitions of a same direction of the laser synchronization signal;
- determining a frequency alignment error between the mirror synchronization signal and the laser synchronization signal as a function of a difference between the first and second numbers of pulses; and
- adjusting a frequency of the laser clock signal as a function of the frequency alignment error such that the laser synchronization signal has its frequency aligned with that of the mirror synchronization signal.

20. The method of claim 19, wherein the laser clock signal is generated using a digitally controlled phase locked loop; and further comprising operating in a frequency alignment mode to generate a first control word for the digitally controlled phase locked loop as a function of the frequency alignment error to cause the digitally controlled phase locked loop to generate the laser synchronization signal as having a frequency aligned with that of the mirror synchronization signal.

21. The method of claim 20, wherein the first control word is generated using a proportional-integral-derivative control scheme.

22. The method of claim 20, further comprising operating in a phase alignment mode, after frequency alignment between the laser synchronization signal and the mirror synchronization signal has been achieved, to:
- count a third number of pulses of the laser clock signal between an edge of the mirror synchronization signal and an edge of the laser synchronization signal having a same edge type as that of the edge of the mirror synchronization signal; and
- generate a second control word for the digitally controllable phase locked loop to be added to the first control word, based upon the third number of pulses.

* * * * *